United States Patent
Kuan et al.

(10) Patent No.: US 8,536,692 B2
(45) Date of Patent: Sep. 17, 2013

(54) MOUNTABLE INTEGRATED CIRCUIT PACKAGE SYSTEM WITH MOUNTABLE INTEGRATED CIRCUIT DIE

(75) Inventors: Heap Hoe Kuan, Singapore (SG); Seng Guan Chow, Singapore (SG); Linda Pei Ee Chua, Singapore (SG); Dioscoro A. Merilo, Singapore (SG)

(73) Assignee: Stats Chippac Ltd., Singapore (SG)

( * ) Notice: Subject to any disclaimer, the term of this patent is extended or adjusted under 35 U.S.C. 154(b) by 428 days.

(21) Appl. No.: 11/954,601

(22) Filed: Dec. 12, 2007

(65) Prior Publication Data

US 2009/0152700 A1 Jun. 18, 2009

(51) Int. Cl.
*H01L 23/02* (2006.01)

(52) U.S. Cl.
USPC .......... 257/686; 257/E25.013; 257/685; 257/777; 438/109

(58) Field of Classification Search
USPC ............ 257/E21.502, E23.169, 685, 686, 257/723, 777, 783, E25.013; 438/109, 108
See application file for complete search history.

(56) References Cited

U.S. PATENT DOCUMENTS

| | | | |
|---|---|---|---|
| 5,333,505 A | 8/1994 | Takahashi et al. | |
| 5,373,189 A | 12/1994 | Massit et al. | |
| 5,950,070 A * | 9/1999 | Razon et al. | 438/113 |
| 6,043,109 A * | 3/2000 | Yang et al. | 438/113 |
| 6,239,496 B1 | 5/2001 | Asada | |
| 6,252,308 B1 | 6/2001 | Akram et al. | |
| 6,268,654 B1 | 7/2001 | Glenn et al. | |
| 6,291,884 B1 * | 9/2001 | Glenn et al. | 257/747 |
| 6,340,846 B1 * | 1/2002 | LoBianco et al. | 257/783 |
| 6,401,545 B1 | 6/2002 | Monk et al. | |
| 6,492,726 B1 | 12/2002 | Quek et al. | |
| 6,633,081 B2 | 10/2003 | Sahara et al. | |
| 6,653,723 B2 * | 11/2003 | Manansala | 257/680 |
| 6,727,579 B1 | 4/2004 | Eldridge et al. | |
| 6,730,543 B2 | 5/2004 | Akram | |
| 6,861,288 B2 | 3/2005 | Shim et al. | |
| 6,962,282 B2 * | 11/2005 | Manansala | 228/180.5 |
| 6,995,448 B2 * | 2/2006 | Lee et al. | 257/516 |
| 6,998,721 B2 * | 2/2006 | Zhou | 257/790 |
| 7,026,709 B2 * | 4/2006 | Tsai et al. | 257/686 |
| 7,026,710 B2 * | 4/2006 | Coyle et al. | 257/704 |
| 7,031,500 B1 * | 4/2006 | Shinohara | 382/124 |
| 7,138,706 B2 * | 11/2006 | Arai et al. | 257/678 |
| 7,187,067 B2 | 3/2007 | Weng et al. | |
| 7,227,253 B2 | 6/2007 | Tsai et al. | |

(Continued)

FOREIGN PATENT DOCUMENTS

| | | |
|---|---|---|
| JP | 2000-228468 A | 8/2000 |
| TW | 200410345 | 6/2004 |

(Continued)

OTHER PUBLICATIONS

Office Action from TW Application No. 97142598 dated Sep. 20, 2012.

*Primary Examiner* — Chris Chu

(74) *Attorney, Agent, or Firm* — Ishimaru & Associates LLP

(57) ABSTRACT

A mountable integrated circuit package system includes: mounting an integrated circuit die over a package carrier; connecting a first internal interconnect between the integrated circuit die and the package carrier; and forming a package encapsulation over the package carrier and the first internal interconnect, with the integrated circuit die partially exposed within a recess of the package encapsulation.

20 Claims, 2 Drawing Sheets

(56) References Cited

U.S. PATENT DOCUMENTS

| | | | |
|---|---|---|---|
| 7,245,008 B2 * | 7/2007 | Lee | 257/686 |
| 7,276,393 B2 | 10/2007 | Derderian et al. | |
| 7,288,835 B2 * | 10/2007 | Yim et al. | 257/685 |
| 7,298,033 B2 * | 11/2007 | Yoo | 257/686 |
| 7,309,913 B2 | 12/2007 | Shim et al. | |
| 7,354,800 B2 | 4/2008 | Carson | |
| 7,391,105 B2 * | 6/2008 | Yeom | 257/686 |
| 7,468,556 B2 * | 12/2008 | Logan et al. | 257/723 |
| 7,504,284 B2 * | 3/2009 | Ye et al. | 438/109 |
| 7,521,790 B2 * | 4/2009 | Tanida et al. | 257/704 |
| 7,535,086 B2 | 5/2009 | Merilo et al. | |
| 7,557,443 B2 * | 7/2009 | Ye et al. | 257/723 |
| 7,589,408 B2 * | 9/2009 | Weng et al. | 257/686 |
| 7,683,469 B2 * | 3/2010 | Oh et al. | 257/686 |
| 2002/0030261 A1 | 3/2002 | Rolda, Jr. et al. | |
| 2003/0025188 A1 | 2/2003 | Farnworth et al. | |
| 2003/0094683 A1 | 5/2003 | Poo et al. | |
| 2003/0222344 A1 | 12/2003 | Hosoyamada et al. | |
| 2004/0026773 A1 | 2/2004 | Koon et al. | |
| 2004/0262734 A1 * | 12/2004 | Yoo | 257/686 |
| 2005/0090050 A1 | 4/2005 | Shim et al. | |
| 2005/0205978 A1 | 9/2005 | Pu et al. | |
| 2005/0205996 A1 | 9/2005 | Usui et al. | |
| 2005/0253241 A1 | 11/2005 | Hall | |
| 2006/0014328 A1 * | 1/2006 | Shimonaka et al. | 438/127 |
| 2006/0076690 A1 | 4/2006 | Khandros et al. | |
| 2006/0171698 A1 | 8/2006 | Ryu et al. | |
| 2006/0220256 A1 | 10/2006 | Shim et al. | |
| 2006/0244157 A1 | 11/2006 | Carson | |
| 2006/0256525 A1 | 11/2006 | Shim et al. | |
| 2007/0108581 A1 | 5/2007 | Shim et al. | |
| 2007/0181989 A1 | 8/2007 | Corisis et al. | |
| 2007/0181990 A1 | 8/2007 | Huang et al. | |
| 2007/0190690 A1 | 8/2007 | Chow et al. | |
| 2007/0200257 A1 | 8/2007 | Chow et al. | |
| 2007/0216010 A1 | 9/2007 | Yim et al. | |
| 2007/0241442 A1 | 10/2007 | Ha et al. | |
| 2007/0246815 A1 * | 10/2007 | Lu et al. | 257/686 |
| 2007/0278696 A1 | 12/2007 | Lu et al. | |
| 2008/0157325 A1 | 7/2008 | Chow et al. | |
| 2008/0217761 A1 | 9/2008 | Yang et al. | |
| 2009/0152692 A1 | 6/2009 | Chow et al. | |
| 2009/0152706 A1 | 6/2009 | Kuan et al. | |
| 2009/0155960 A1 | 6/2009 | Chow et al. | |

FOREIGN PATENT DOCUMENTS

| | | |
|---|---|---|
| TW | 200614393 | 5/2006 |
| TW | 200707697 | 2/2007 |
| TW | 200707700 | 2/2007 |

* cited by examiner

MOUNTABLE INTEGRATED CIRCUIT PACKAGE SYSTEM WITH MOUNTABLE INTEGRATED CIRCUIT DIE

CROSS-REFERENCE TO RELATED APPLICATION(S)

The present application contains subject matter related to concurrently filed U.S. patent application Ser. No. 11/954, 607, now U.S. Pat. No. 7,985,628. The related application is assigned to STATS ChipPAC Ltd.

The present application also contains subject matter related to concurrently filed U.S. patent application Ser. No. 11/954, 613, now U.S. Pat. No. 7,781,261. The related application is assigned to STATS ChipPAC Ltd.

The present application further contains subject matter related to concurrently filed U.S. patent application Ser. No. 11/954,603, now U.S. Pat. No. 8,084,849. The related application is assigned to STATS ChipPAC Ltd.

TECHNICAL FIELD

The present invention relates generally to an integrated circuit package system and more particularly to an encapsulated integrated circuit package system.

BACKGROUND ART

In order to interface an integrated circuit with other circuitry, it is common to mount it on a lead frame or substrate. Each integrated circuit has bonding pads that are individually connected to the substrate's contact or terminal pads using extremely fine gold or aluminum wires or conductive balls, such as solder balls. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". Particularly acute, the needs for portable personal electronics, such as cell phones, digital cameras, music players, personal digital assistants (PDA's), and location-based devices, have further driven the need for increased integrated circuit density.

This increased integrated circuit density has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a printed circuit board (PCB) substrate onto which a set of separate integrated circuit components are directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. Moreover, the substrate and integrated circuit are often damaged during assembly or testing, complicating the manufacturing process and increasing costs.

For both vertical and horizontal multi-chip packages, assembly of the multi-chip packages must have reliable electrical and mechanical attachments between the multiple integrated circuits, the stacked packaged integrated circuits, or a combination thereof. For example, the encapsulating process for forming the packaged integrated circuit may cause contamination, such as mold flash or bleed, impeding reliable attachments. Another example, for integrated circuit packages having a recess in the encapsulation, contoured mold chase are used to form the recess which increases the risk of mold flashes, damage to the package structure from contact with the contoured portion of the mold chase, and the manufacturing cost to design specific mold chase for the desired recess in the encapsulation.

Thus, a need still remains for an integrated circuit package system providing low cost manufacturing, improved yield, improved reliability, and greater flexibility to offer more functionality and fewer footprints on the printed circuit board. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a mountable integrated circuit package system including: mounting an integrated circuit die over a package carrier; connecting a first internal interconnect between the integrated circuit die and the package carrier; and forming a package encapsulation over the package carrier and the first internal interconnect, with the integrated circuit die partially exposed within a recess of the package encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
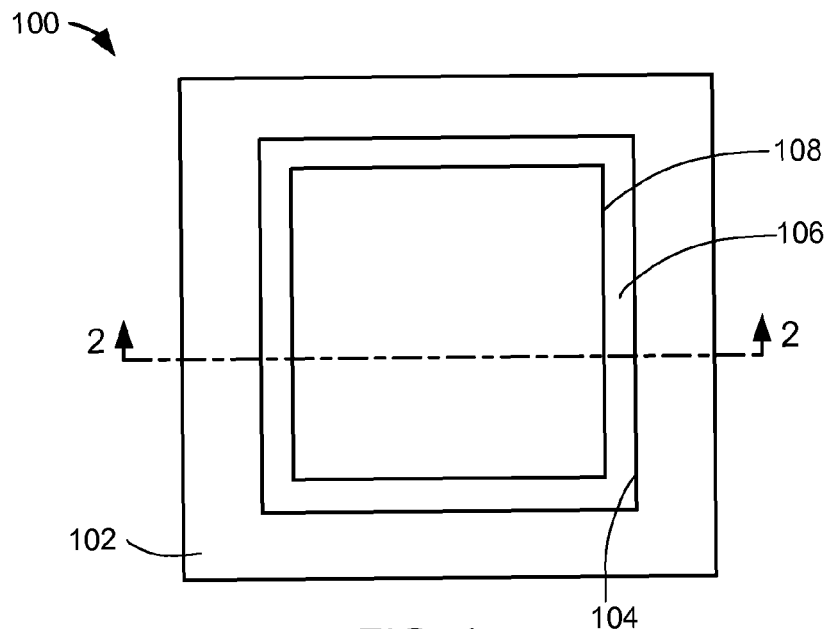
FIG. 1 is a top view of a mountable integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of a mountable integrated circuit package system 100 in a first embodiment of the present invention. The mountable integrated circuit package system 100 includes a package encapsulation 102, such as an epoxy molding compound having a recess 104. An integrated circuit die 106 is partially exposed within the recess 104 of the package encapsulation 102. A mounting integrated circuit device 108 is mounted over the integrated circuit die 106 within the recess 104. The mounting integrated circuit device 108 may include a flip chip or packaged integrated circuits of single or multi-stacked dice.

Figure 2:
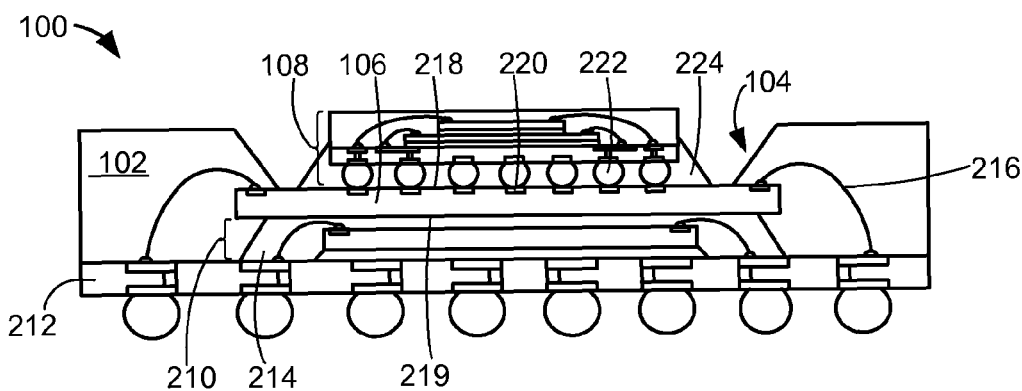
FIG. 2 is a cross-sectional view of the mountable integrated circuit package system along line 2-2 of FIG. 1.

Referring now to FIG. 2, therein is shown a cross-sectional view of the mountable integrated circuit package system 100 along line 2-2 of FIG. 1. The cross-sectional view depicts the integrated circuit die 106 mounted over a first integrated circuit device 210 mounted to a package carrier 212, such as a laminated substrate. The first integrated circuit device 210 with an inner encapsulation 214 may include, for example, a packaged integrated circuit device of single or multi-stacked die, such as a wire-bond die. A first internal interconnect 216, such as a bond wire or a ribbon bond wire, connects the integrated circuit die 106 and the package carrier 212.

The integrated circuit die 106 includes an active die side 218 and a non-active die side 219, opposing the active die side 218, with electrical contacts 220 on the active die side 218. The integrated circuit die 106 is mounted over the first integrated circuit device 210 with the non-active die side 219 of the integrated circuit die 106 facing the inner encapsulation 214, such as an epoxy molding compound. The first internal interconnect 216 electrically connects the active die side 218 to the package carrier 212. The first integrated circuit device 210 is connected to the package carrier 212.

The package encapsulation 102 covers the package carrier 212, the first integrated circuit device 210, the integrated circuit die 106, the first internal interconnect 216, and partially exposing the electrical contacts 220 of the integrated circuit die 106 within the recess 104 of the package encapsulation 102. The mounting integrated circuit device 108 is mounted over the electrical contacts 220 within the recess 104. Preferably, the mounting integrated circuit device 108 includes mounting interconnects 222, such as solder bumps, mounted on the electrical contacts 220. Optionally, an underfill 224 may be provided to encapsulate the mounting interconnects 222 and the electrical contacts 220.

It has been discovered that the present invention provides a low profile mountable integrated circuit package system that reduces the overall package height by partially exposing an integrated circuit die having electrical contacts within a recess of a package encapsulation for mounting an integrated circuit device. The mountable integrated circuit package system of this invention further reduces the processing and overall cost of manufacturing of these package-on-packages by eliminating the need for an extra mounting substrate onto which a mounting integrated circuit device typically mounts.

Figure 3:
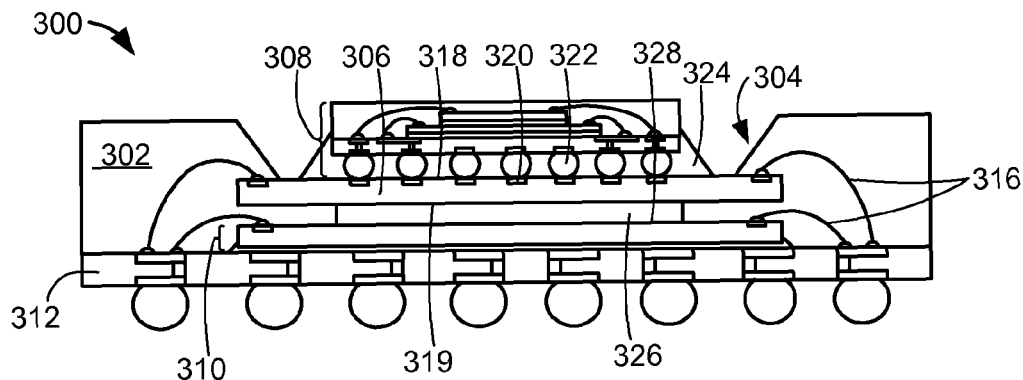
FIG. 3 is a cross-sectional view of a mountable integrated circuit package system exemplified by the top view of FIG. 1 in a second embodiment of the present invention.

Referring now to FIG. 3, therein is shown a cross-sectional view of a mountable integrated circuit package system 300 exemplified by the top view of FIG. 1 in a second embodiment of the present invention. The cross-sectional view depicts an integrated circuit die 306 mounted over a first integrated circuit device 310 mounted to a package carrier 312, such as a laminated substrate. The first integrated circuit device 310 may include, for example, a flip chip die. A first internal interconnect 316, such as a bond wire or a ribbon bond wire, connects between the integrated circuit die 306 and the package carrier 312. The first internal interconnect 316 may also connect between the first integrated circuit device 310 and the package carrier 312.

The integrated circuit die 306 includes an active die side 318 and a non-active die side 319, opposing the active die side 318, with electrical contacts 320 on the active die side 318. The integrated circuit die 306 is mounted with a first adhesive 326, such as a wire-in-film adhesive, over a first active side 328 of the first integrated circuit device 310, with the non-active die side 319 of the integrated circuit die 306 facing the first active side 328. The first internal interconnect 316 connects the active die side 318 and the package carrier 312, and also electrically connects the first active side 328 and the package carrier 312. Although the first adhesive 326 is shown not covering the first internal interconnect 316 on the first active side 328, it is understood that the first adhesive 326 may cover the first active side 328 including the first internal interconnect 316.

A package encapsulation 302 covers the package carrier 312, the first integrated circuit device 310, the first internal interconnect 316, and partially exposing the electrical contacts 320 of the integrated circuit die 306 within a recess 304 of the package encapsulation 302. A mounting integrated circuit device 308, such as a flip chip or a packaged integrated circuit of single or multi-stacked dice, is mounted over the integrated circuit die 306 within the recess 304. Preferably, the mounting integrated circuit device 308 includes mounting interconnects 322, such as solder bumps, mounted on the electrical contacts 320. Optionally, an underfill 324 may be provided to encapsulate the mounting interconnects 322 and the electrical contacts 320.

Figure 4:
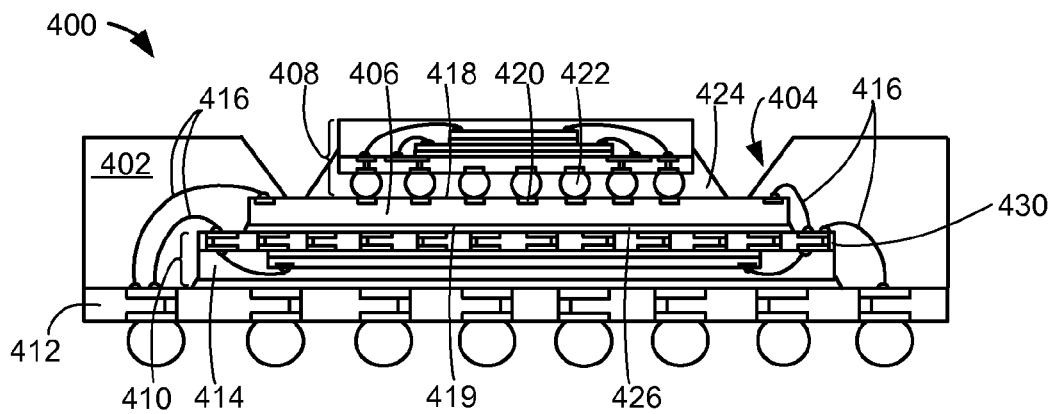
FIG. 4 is a cross-sectional view of a mountable integrated circuit package system emplified by the top view of FIG. 1 in a third embodiment of the present invention.

Referring now to FIG. 4, therein is shown a cross-sectional view of a mountable integrated circuit package system 400 exemplified by the top view of FIG. 1 in a third embodiment of the present invention. The cross-sectional view depicts an integrated circuit die 406 mounted over a first integrated circuit device 410 mounted to a package carrier 412, such as a laminated substrate. The first integrated circuit device 410 with an inner encapsulation 414 may include, for example, a packaged integrated circuit mounted to a first substrate 430, such as a laminate substrate. A first internal interconnect 416, such as a bond wire or a ribbon bond wire, connects between the integrated circuit die 406 and the package carrier 412. The first internal interconnect 416 may also connect between the first integrated circuit device 410 and the package carrier 412.

The integrated circuit die 406 includes an active die side 418 and a non-active die side 419, opposing the active die side 418, with electrical contacts 420 on the active die side 418. The integrated circuit die 406 is mounted with a first adhesive 426, such as a die-attach adhesive, over the first substrate 430 of the first integrated circuit device 410, with the non-active die side 419 of the integrated circuit die 406 facing the first substrate 430. The first internal interconnect 416 connects the active die side 418 and the package carrier 412, and also electrically connects the first substrate 430 and the package carrier 412. Optionally, the first internal interconnect 416 may also connect between the active die side 418 and the first substrate 430.

A package encapsulation 402 covers the package carrier 412, the first integrated circuit device 410, the first internal interconnect 416, and partially exposing the electrical contacts 420 of the integrated circuit die 406 within a recess 404 of the package encapsulation 402. A mounting integrated circuit device 408, such as a flip chip or a packaged integrated circuit of single or multi-stacked dice, is mounted over the electrical contacts 420 within the recess 404. Preferably, the mounting integrated circuit device 408 includes mounting interconnects 422, such as solder bumps, mounted on the electrical contacts 420. Optionally, an underfill 424 may be provided to encapsulate the mounting interconnects 422 and the electrical contacts 420.

Figure 5:
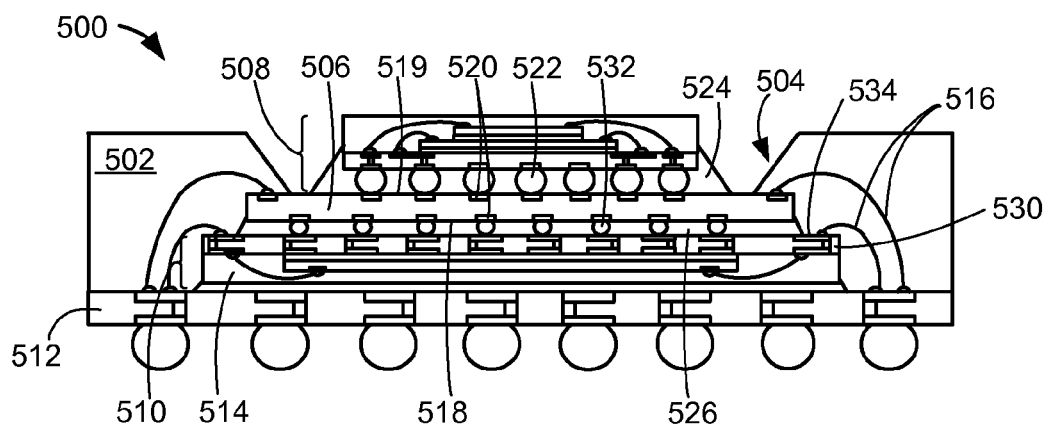
FIG. 5 is a cross-sectional view of a mountable integrated circuit package system exemplified by the top view of FIG. 1 in a fourth embodiment of the present invention.

Referring now to FIG. 5, therein is shown a cross-sectional view of a mountable integrated circuit package system 500 exemplified by the top view of FIG. 1 in a fourth embodiment of the present invention. The cross-sectional view depicts an integrated circuit die 506 mounted over a first integrated circuit device 510 mounted to a package carrier 512, such as a laminated substrate. The first integrated circuit device 510 with an inner encapsulation 514 may include, for example, a packaged integrated circuit mounted to a first substrate 530, such as a laminate substrate. A first internal interconnect 516, such as bond wires or ribbon bond wires, connect between the integrated circuit die 506 and the package carrier 512. The first internal interconnect 516 also connect between the first integrated circuit device 510 and the package carrier 5 12.

The integrated circuit die 506 includes an active die side 518 and a non-active die side 519 opposing the active die side 518. The active die side 518 and the non-active die side 519 include electrical contacts 520, such as in a redistribution layer (RDL) or a through silicon via (TSV) with conductive traces for further electrical connections. The integrated circuit die 506 is mounted over the first substrate 530 of the first integrated circuit device 510 with the active die side 518 facing the first substrate 530. The integrated circuit die 506 is mounted with a second internal interconnect 532, such as a solder bump, electrically connecting between the electrical contacts 520 on the active die side 518 and a first substrate side 534 of the first substrate 530. Optionally, an underfill 526 maybe provided to encapsulate the second internal interconnect 532. The first internal interconnect 516 connects the non-active die side 519 and the package carrier 512, and also electrically connects the first substrate side 534 and the package carrier 512.

A package encapsulation 502 covers the package carrier 512, the first integrated circuit device 510, the first internal interconnect 516, and partially exposing the electrical contacts 520 of the non-active die side 519 within a recess 504 of the package encapsulation 502. A mounting integrated circuit device 508, such as a flip chip or a packaged integrated circuit of single or multi-stacked dice, is mounted over the electrical contacts 520 of the non-active die side 519 within the recess 504. Preferably, the mounting integrated circuit device 508 includes mounting interconnects 522, such as solder bumps, mounted on the electrical contacts 520 within the recess 504. Optionally, an underfill 524 may be provided to encapsulate the mounting interconnects 522 and the electrical contacts 520.

Figure 6:
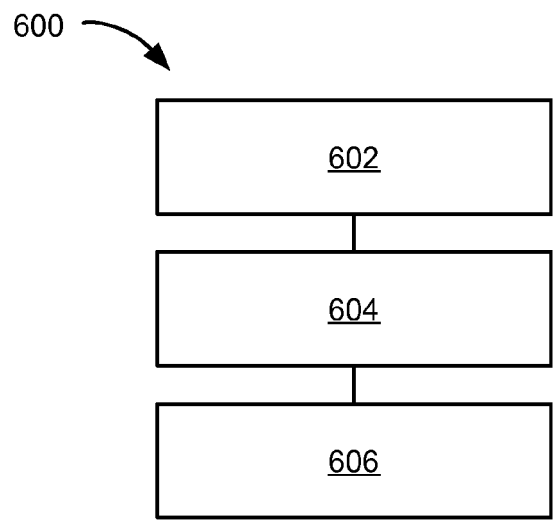
FIG. 6 is a flow chart of a mountable integrated circuit package system for manufacturing of the mountable integrated circuit package system in an embodiment of the present invention.

Referring now to FIG. 6, therein is shown a flow chart of a mountable integrated circuit package system 600 for manufacturing the mountable integrated circuit package system 100 in an embodiment of the present invention. The system 600 includes: mounting an integrated circuit die over a first integrated circuit device mounted to a package carrier in a block 602; connecting a first internal interconnect between the integrated circuit die and the package carrier in a block 604; and forming a package encapsulation over the package carrier, the first integrated circuit device, the first internal interconnect, with the integrated circuit die partially exposed within a recess of the package encapsulation in a block 606.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the mountable integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a mountable integrated circuit package system comprising:
   mounting a first integrated circuit device having an inner encapsulation over a package carrier;
   mounting an integrated circuit die having electrical contacts over the first integrated device;
   connecting a first internal interconnect between the integrated circuit die and the package carrier; and
   forming a package encapsulation over the package carrier covering the first integrated circuit device, the integrated circuit die, and the first internal interconnect, with the electrical contacts partially exposed within a recess of the package encapsulation.

2. The method as claimed in claim 1 further comprising mounting a mounting integrated circuit device over the integrated circuit die.

3. The method as claimed in claim 1 wherein:
   mounting the first integrated circuit device includes connecting the first integrated circuit device and the package carrier; and
   mounting the integrated circuit die includes mounting the integrated circuit die over the first integrated circuit device.

4. The method as claimed in claim 1 wherein mounting the integrated circuit die includes mounting the integrated circuit die over a first substrate of a first integrated circuit device.

5. The method as claimed in claim 1 wherein mounting the integrated circuit die includes:
   mounting the integrated circuit die over a first substrate of the first integrated circuit device; and
   connecting a second internal interconnect between the integrated circuit die and the first substrate.

6. A method of manufacture of a mountable integrated circuit package system comprising:
   mounting a first integrated circuit device having an inner encapsulation on a package carrier, the first integrated circuit device having a wire-bond die;
   mounting an integrated circuit die having electrical contacts over the first integrated circuit device;
   connecting a first internal interconnect between the integrated circuit die and the package carrier; and
   forming a package encapsulation over the package carrier, covering the first integrated circuit device, the integrated circuit die, and the first internal interconnect, with the electrical contacts partially exposed within a recess of the package encapsulation.

7. The method as claimed in claim 6 further comprising mounting a mounting integrated circuit device over the electrical contacts.

8. The method as claimed in claim 6 wherein mounting the integrated circuit die includes mounting the integrated circuit die over the inner encapsulation of the first integrated circuit device.

9. The method as claimed in claim 6 wherein mounting the integrated circuit die includes:
   mounting the integrated circuit die over a first substrate of the first integrated circuit device; and
   mounting the first integrated circuit device over the package carrier.

10. The method as claimed in claim 6 wherein mounting the integrated circuit die includes:
    attaching a second internal interconnect under the integrated circuit die; and
    mounting the integrated circuit die over a first substrate of the first integrated circuit device with the second internal interconnect connected to the first substrate.

11. A mountable integrated circuit package system comprising:
    a package carrier;
    a first integrated circuit device having an inner encapsulation mounted over the package carrier;
    an integrated circuit die having electrical contacts mounted over the first integrated circuit device;
    a first internal interconnect connected between the integrated circuit die and the package carrier; and
    a package encapsulation over the package carrier with the package encapsulation covering the first integrated circuit device, the integrated circuit die, and the first internal interconnect, and with the electrical contacts partially exposed within a recess of the package encapsulation.

12. The system as claimed in claim 11 further comprising a mounting integrated circuit device mounted over the integrated circuit die.

13. The system as claimed in claim 11 wherein:
    the first integrated circuit device is connected to the package carrier; and
    the integrated circuit die is mounted over a first integrated circuit device.

14. The system as claimed in claim 11 wherein the integrated circuit die is mounted over a first substrate of a first integrated circuit device.

15. The system as claimed in claim 11 wherein:
    the integrated circuit die is mounted over a first substrate of a first integrated circuit device; and
    further comprising:
    a second internal interconnect connected between the integrated circuit die and the first substrate.

16. The system as claimed in claim 11 wherein:
    the first integrated circuit device includes a wire-bond die.

17. The system as claimed in claim 16 further comprising:
    an integrated circuit device mounted over the electrical contacts.

18. The system as claimed in claim 16 wherein the integrated circuit die is mounted over the inner encapsulation of the first integrated circuit device.

19. The system as claimed in claim 16 wherein:
    the integrated circuit die is mounted over a first substrate of the first integrated circuit device; and
    the first integrated circuit device is mounted over the package carrier.

20. The system as claimed in claim 16 further comprising:
    a second internal interconnect is attached under the integrated circuit die; and
    wherein:
    the second internal interconnect is connected between the integrated circuit die and the first substrate.

* * * * *